(12) United States Patent
Kim et al.

(10) Patent No.: US 9,147,488 B2
(45) Date of Patent: Sep. 29, 2015

(54) NONVOLATILE MEMORY DEVICE, MEMORY SYSTEM HAVING THE SAME, EXTERNAL POWER CONTROLLING METHOD THEREOF

(71) Applicant: Samsung Electronics Co., Ltd., Suwon-Si, Gyeonggi-Do (KR)

(72) Inventors: TaeHyun Kim, Seongnam-si (KR); June-Hong Park, Seongnam-si (KR); Sungwhan Seo, Hwaseong-si (KR); Jinyub Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 64 days.

(21) Appl. No.: 14/061,019

(22) Filed: Oct. 23, 2013

(65) Prior Publication Data
US 2014/0204680 A1    Jul. 24, 2014

(30) Foreign Application Priority Data

Jan. 18, 2013    (KR) .................. 10-2013-0005920

(51) Int. Cl.
| G11C 16/04 | (2006.01) |
| G11C 16/30 | (2006.01) |
| G11C 16/12 | (2006.01) |

(52) U.S. Cl.
CPC ............ *G11C 16/30* (2013.01); *G11C 16/0483* (2013.01); *G11C 16/12* (2013.01)

(58) Field of Classification Search
USPC .................... 365/185.18, 185.25, 185.28
See application file for complete search history.

(56) References Cited

U.S. PATENT DOCUMENTS

| 5,495,453 | A | * | 2/1996 | Wojciechowski et al. ............... 365/185.18 |
| 6,160,429 | A | | 12/2000 | Morrill |
| 6,215,342 | B1 | | 4/2001 | Morrill |
| 7,276,959 | B2 | | 10/2007 | Cho et al. |
| 7,304,531 | B2 | | 12/2007 | Kim |
| 7,626,882 | B2 | | 12/2009 | Yang et al. |
| 7,688,647 | B2 | | 3/2010 | Jung |
| 7,710,795 | B2 | | 5/2010 | Kang |

FOREIGN PATENT DOCUMENTS

| KR | 10-0689804 B1 | 3/2007 |
| KR | 10-0748458 B1 | 8/2007 |
| KR | 10-0794991 B1 | 1/2008 |
| KR | 10-0941631 B1 | 2/2010 |
| KR | 10-1020278 B1 | 3/2011 |

* cited by examiner

*Primary Examiner* — Hoai V Ho
(74) *Attorney, Agent, or Firm* — Harness, Dickey & Pierce, P.L.C.

(57) ABSTRACT

An external power control method includes determining whether to apply a second external voltage to a first node according to a drop of a first external voltage; generating a flag signal according to a drop of the second external voltage when the second external voltage is applied to the first node; transferring a voltage of the first node to a second node in response to the flag signal; and discharging at least one voltage of an internal circuit connected to the second node in response to the flag signal.

30 Claims, 17 Drawing Sheets

NONVOLATILE MEMORY DEVICE, MEMORY SYSTEM HAVING THE SAME, EXTERNAL POWER CONTROLLING METHOD THEREOF

CROSS-REFERENCE TO RELATED APPLICATIONS

A claim for priority under 35 U.S.C. §119 is made to Korean Patent Application No. 10-2013-0005920 filed Jan. 18, 2013, in the Korean Intellectual Property Office, the entire contents of which are hereby incorporated by reference.

BACKGROUND

The inventive concepts described herein relate to a nonvolatile memory device, a memory system including the nonvolatile memory device, and/or an external power control method.

Semiconductor memory devices may be volatile or nonvolatile. A nonvolatile semiconductor memory device may retain data stored therein even at power-off. The nonvolatile memory device may be permanent or reprogrammable, depending upon the fabrication technology used. The nonvolatile memory device may be used for user data, program, and microcode storage in a wide variety of applications in the computer, avionics, telecommunications, and consumer electronics industries. A nonvolatile memory device often utilizes an external supply voltage, however, a typical nonvolatile memory device may not detect a drop in voltage level of the supply voltage and control an internal circuit according to the detection result. Which may result in problems in reliably operating the nonvolatile memory device.

SUMMARY

One aspect of example embodiments of the inventive concepts are directed to provide an external power control method of a nonvolatile memory device.

In one embodiment, the method may include determining whether to apply a second external voltage to a first node according to a drop of a first external voltage; generating a flag signal according to a drop of the second external voltage when the second external voltage is applied to the first node; transferring a voltage of the first node to a second node in response to the flag signal; and discharging at least one voltage of an internal circuit connected to the second node in response to the flag signal, wherein the determining whether to apply a second external voltage to a first node according to a drop of a first external voltage comprises generating a detection signal when the first external voltage is dropped; and applying the second external voltage to the first node in response to the detection signal.

Another aspect of example embodiments of the inventive concepts is directed to a nonvolatile memory device.

In one embodiment, the memory device may include a memory cell array having a plurality of memory blocks; external power control logic configured to receive first and second external voltages, to detect whether the first and second external voltages are dropped, and to decide whether to block the first and second external voltages according to the detection result, the second external voltage being higher than the first external voltage; a voltage generating circuit configured to generate driving voltages based on the first and second external voltages provided through the external power control logic; an address decoder configured to select one of the memory blocks in response to an address and to provide the driving voltages to the selected block; an input/output circuit configured to temporarily store data to be programmed at memory cells of the selected memory block or data read from memory cells of the selected memory block; and control logic configured to control the voltage generating circuit, the address decoder, and the input/output circuit.

Still another aspect of example embodiments of the inventive concepts are directed to a memory system.

In one embodiment, the memory system may include at least one nonvolatile memory device; and a memory controller configured to control the at least one nonvolatile memory device. The at least one nonvolatile memory device comprises external power control logic configured to determine an application of a second external voltage to an internal circuit according to a drop of a first external voltage and to generate a flag signal according to a drop of the second external voltage when the second external voltage is applied to the internal circuit, the second external voltage being higher than the first external voltage; and an external voltage set register configured to receive an external voltage command indicating whether the second external voltage is applied to the nonvolatile memory device from an external device and to store data corresponding to the external voltage command.

In one embodiment, the memory device includes an internal circuit including a memory cell array having a plurality of memory blocks therein; and a power controller configured to, supply one or more of a first external voltage and a second external voltage to the internal circuit, detect a voltage decrease in the first external voltage and the second external voltage, and prohibit supply of the second external voltage to the internal circuit, if the power controller detects the voltage decrease in one of the first external voltage and the second external voltage.

In one embodiment, the power controller further includes a first external voltage detector including a plurality of transistors configured to generate a detection signal in response to detecting the voltage decrease in the first external voltage; and a second external voltage detector including, a voltage divider configured to divide the second external voltage, a comparator configured to compare the divided voltage and a reference voltage, and generate a flag signal if the divided voltage is lower than the reference voltage.

In one embodiment, the second external voltage has a higher voltage than the first external voltage, and the internal circuit further includes a voltage generator configured to, receive the first external voltage from the power controller, selectively receive the second external voltage, if the power controller does not detect voltage decrease in one of the first external voltage and the second external voltage, and generate driving voltages to drive the memory cell array using the first external voltage and the second external voltage; and an internal controller configured to, receive a flag signal from the power controller, the flag signal indicating whether the power controller detects the voltage decrease in the second external voltage.

In one embodiment, the internal controller is configured to instruct the nonvolatile memory device to discharge word lines and bit lines connected to the plurality of memory blocks if the flag signal indicates that the power controller has detected the voltage decrease in the second external voltage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
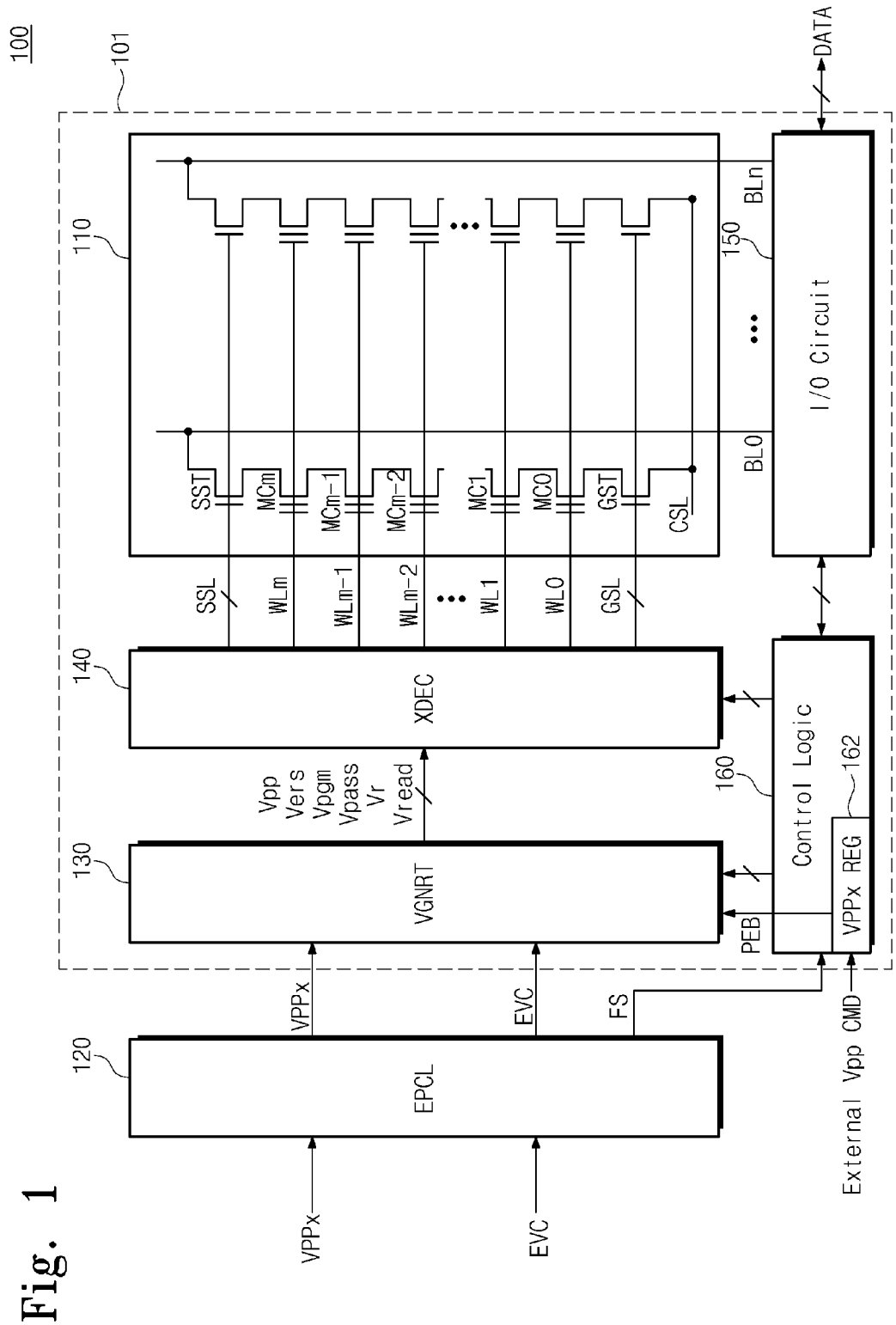
FIG. 1 is a block diagram schematically illustrating a nonvolatile memory device 100 according to an example embodiment of the inventive concepts.

Example embodiments will be described in detail with reference to the accompanying drawings. The inventive concepts, however, may be embodied in various different forms, and should not be construed as being limited only to the illustrated embodiments. Rather, these example embodiments are provided as examples so that this disclosure will be thorough and complete, and will fully convey the inventive concepts to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device 100 according to an example embodiment of the inventive concepts.

Referring to FIG. 1, a nonvolatile memory device 100 may include a memory cell array 110, external power control logic (EPCL) 120, a voltage generating circuit (VGNRT) 130, an address decoder (XDEC) 140, an input/output circuit 150, and control logic 160.

The nonvolatile memory device 100 may be a NAND flash memory device, for example. However, it is well understood that the nonvolatile memory device 100 is not limited to the NAND flash memory device. For example, the nonvolatile memory device 100 may be a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM), and the like. Further, the nonvolatile memory device can be implemented to have a three-dimensional array structure. The inventive concepts may be applied to a Charge Trap Flash (CTF) memory device including a charge storage layer formed of an insulation film as well as a flash memory device including a charge storage layer formed of a conductive floating gate. Below, the inventive concepts will be described under the condition that the nonvolatile memory device 100 is a NAND flash memory device.

The memory cell array 110 may include a plurality of memory blocks. For an ease of description, FIG. 1 shows a memory block. The memory block may include strings respectively connected to bit lines BL0 to BLn (n being an integer of 2 or more). Here, a string may include at least one string selection transistor SST, memory cells MC0 to MCm (m being an integer of 2 or more), and at least one ground selection transistor GST which are connected in series. The string selection transistor SST may be driven by a voltage transferred through a string selection line SSL. The ground selection transistor GST may be driven by a voltage transferred through a ground selection line GSL. Each of the memory cells may store at least one bit of data, and may be driven by a voltage transferred through a corresponding one of word lines WL0 to WLm.

The external power control logic 120 may receive at least two external voltages EVC and VPPx from an external device (e.g., a memory controller), and may determine whether each of the external voltages EVC and VPPx has dropped. Based on the determination result, the external power control logic 120 may selectively apply the external voltages EVC and VPPx to an internal circuit 101 or generate a flag signal FS for controlling the internal circuit 101. Here, the external voltage VPPx (hereinafter, referred to as a second external voltage) may be higher than the external voltage EVC (hereinafter, referred to as a first external voltage). In example embodiments, the second external voltage VPPx may be about 12V. The internal circuit 101 may constitute elements (e.g., 110, 130, 140, 150, and 160) of the nonvolatile memory device 100 other than the external power control logic 120. The flag signal FS may be a control signal directing an end of a current mode of operation, a switch into a standby mode, discharging of a high voltage, and so on to drive the nonvolatile memory device 100 stably.

In example embodiments, when a drop of the first external voltage EVC is detected, the second external voltage VPPx may not be applied to the internal circuit 101.

In example embodiments, when a drop of the second external voltage VPPx is detected, the flag signal FS may be generated.

In example embodiments, a current mode of the nonvolatile memory device 100 may be ended in response to the flag signal FS. After the current mode is ended, voltages of the word lines WL0 to WLm and the bit lines BL0 to BLn may be discharged.

The voltage generating circuit 130 may generate driving voltages (e.g., Vpp, Vers, Vpgm, Vpass, Vr, Vread, etc.) for driving based on the first external voltage EVC or the second external voltage VPPx. The voltage generating circuit 130 may generate driving voltages (e.g., Vpp, Vers, Vpgm, Vpass, Vr, Vread, etc.) using a pumping operation of the first external voltage EVC through at least one charge pump (not shown) or using a voltage division operation of the second external voltage VPPx. Here, the charge pump may be activated in response to a pump enable signal PEB.

The address decoder 140 may select one of the plurality of memory blocks in response to an address, and may transfer the word lines WL with word line voltages for driving (e.g., a program voltage Vpgm, a pass voltage Vpass, an erase voltage Vers, a verification voltage Vvfy, a read voltage Vr, a read pass voltage Vread, etc.).

At a program operation, the input/output circuit 150 may be configured to temporarily store data input from an external device and to program the temporarily stored data at a selected page. At a read operation, the input/output circuit 150 may be configured to read data from a selected page and to temporarily store the read data. The temporarily stored read data may be output to the external device. The input/output circuit 150 may include page buffers respectively corresponding to the bit lines BL0 to BLn. Each page buffer may include a plurality of latches for a program/read operation.

The control logic 160 may control an overall operation of the nonvolatile memory device 100. The control logic 150 may decode control signals and commands provided from an external memory controller, and may control the voltage generating circuit 130, the address decoder 140, and the input/output circuit 150 according to a decoded result.

The control logic 160 may include an external high voltage set register 162 which is configured to store data corresponding to an external high voltage command received from an external device. In example embodiments, the external high voltage command may be transferred from the external memory controller, and may be issued by a memory controller according to a host request, a user request, or whether an external high voltage VPPx is detected. The control logic 160 may generate the pump enable signal PEB based on data stored at the external high voltage set register 162.

On the other hand, the nonvolatile memory device 100 according to an embodiment of the inventive concept may include the external power control logic 120 which detects the external voltages EVC and VPPx to control the internal circuit 101. Thus, an operation of the nonvolatile memory device 100 may be stable.

Figure 2:
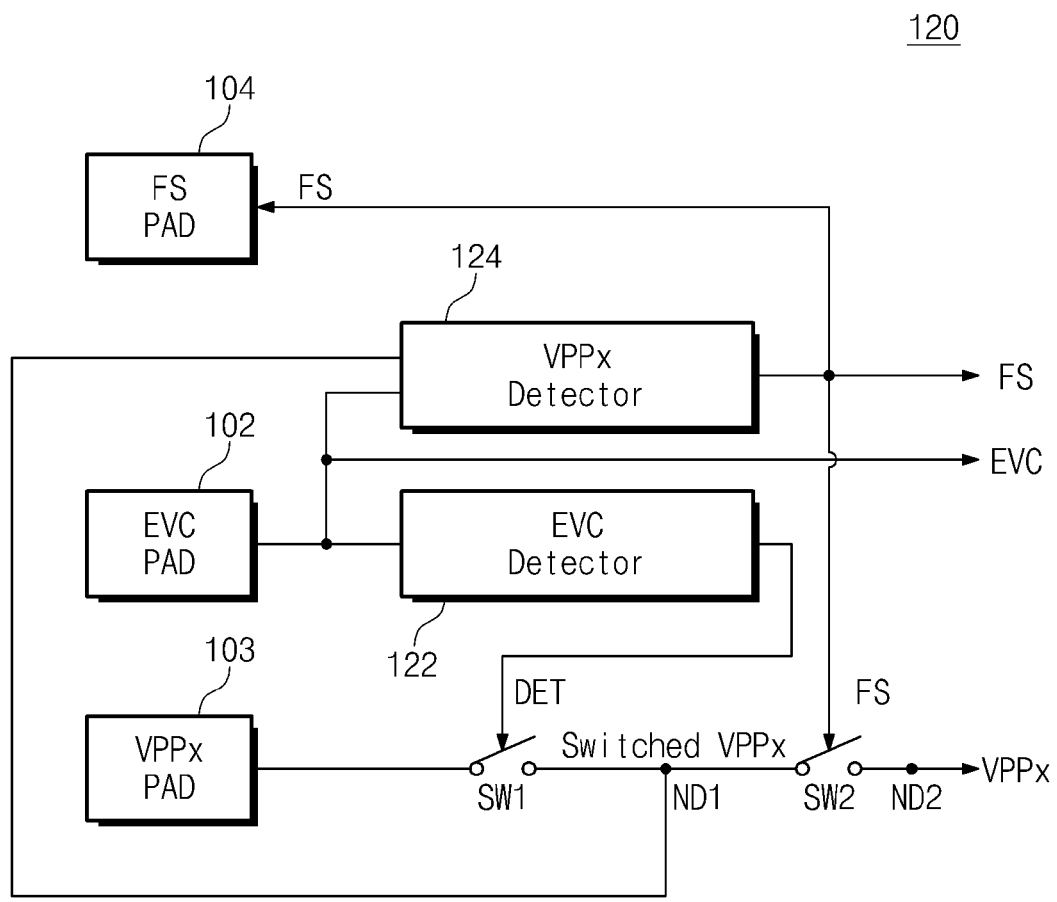
FIG. 2 is a block diagram schematically illustrating external power control logic of FIG. 1.

FIG. 2 is a block diagram schematically illustrating external power control logic 120 of FIG. 1.

Referring to FIG. 2, external power control logic 120 may include a first switch SW1, a second switch SW2, an external voltage detector (or, a first external voltage detector) 122, and an external high voltage detector (or, a second external voltage detector) 124.

The external voltage detector 122 may be connected to an external voltage pad 102 to detect a drop of an external voltage EVC. The external voltage detector 122 may generate a detection signal DET when a drop of the external voltage EVC is detected.

The external high voltage detector 124 may be connected to an external high voltage pad 103 to detect a drop of the external high voltage VPPx. The external high voltage detector 124 may generate the flag signal FS when the external high voltage VPPx is lower than a reference voltage (or, a reference value).

In example embodiments, the flag signal FS may be output to an external memory controller through a flag signal pad 104. The flag signal pad 104 may be an R/B pad when a nonvolatile memory device 100 is a NAND flash memory device. A memory controller may not transfer a command to the nonvolatile memory device 100 in response to the flag signal FS.

In example embodiments, the external high voltage detector 124 may detect the external high voltage VPPx transferred between the first switch SW1 and the second switch SW2.

In other example embodiments, the external high voltage detector 124 may detect the external high voltage VPPx of the external high voltage pad 103. In this case, the flag signal FS may be a combination of the detection signal DET of the external voltage EVC and a signal indicating a drop of the external high voltage VPPx.

In example embodiments, the first switch SW1 may electrically connect the external high voltage pad 103 and a first node ND1 in response to the detection signal DET. The first switch SW1 may be controlled by the detection signal DET. However, the first switch SW1 can be controlled by the flag signal FS. In this case, the first switch SW1 may electrically connect the external high voltage pad 103 and the first node ND1 in response to the flag signal FS.

In example embodiments, the second switch SW2 may electrically connect the external high voltage pad 103 and a second node ND2 in response to the flag signal FS. The external high voltage VPPx applied to the external high voltage pad 103 may be transferred to an internal circuit 101 (refer to FIG. 1) through the second node ND2.

In FIG. 2, a switched high voltage may be transferred to the internal circuit 101 through the second switch SW2. However, example embodiments of the inventive concepts are not limited thereto. The second switch SW2 of the external power control logic 120 can be skipped.

The external power control logic 120 according to an example embodiment of the inventive concepts may protect the internal circuit 101 according to the detection signal DET and the flag signal FS generated by detecting the external voltage EVC and the external high voltage VPPx respectively applied to the external voltage pad 102 and the external high voltage pad 103 are dropped.

Figure 3:
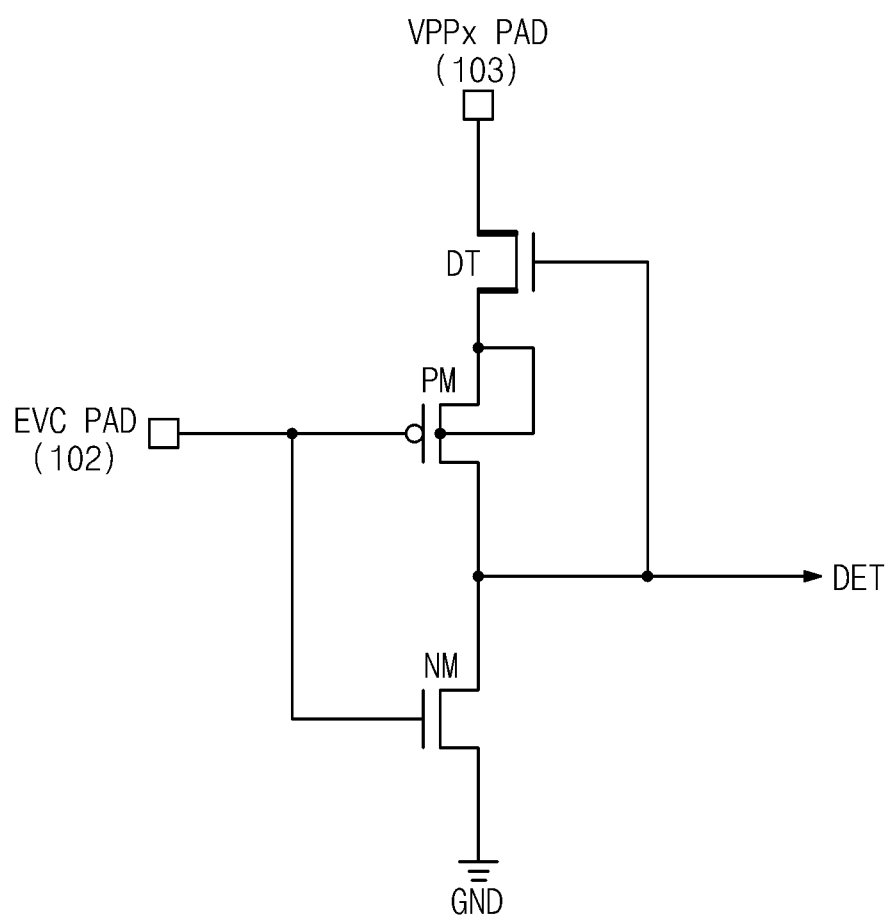
FIG. 3 is a circuit diagram schematically illustrating an external high voltage detector of FIG. 2.

FIG. 3 is a circuit diagram schematically illustrating an external high voltage detector 122 of FIG. 2. Referring to FIG. 3, an external high voltage detector 122 may include an NMOS transistor NM, a PMOS transistor PM, and a depletion transistor DT. The NMOS and PMOS transistors NM and PM may be connected in series, and gates thereof may be connected to an external voltage pad 102. The depletion transistor DT may be connected between an external high voltage pad 103 and the PMOS transistor PM. A gate of the depletion transistor DT may be connected to an output terminal and provide a detection signal DET to the output terminal.

In operation, when an external voltage EVC is received via the external voltage pad 102, the NMOS transistor NM may be turned on and the PMOS transistor PM may be turned off.

At this time, the detection signal DET may have a ground voltage. When the external voltage EVC is received, the NMOS transistor NM may be turned off and the PMOS transistor PM may be turned on. At this time, the detection signal DET may have a voltage of an external high voltage pad 103.

In FIG. 3, the depletion transistor DT may be used to protect a low voltage circuit from the high voltage VPPx. However, the inventive concepts are not limited thereto. For example, the external voltage detector 122 according to an example embodiment of the inventive concepts can use a high voltage transistor instead of the depletion transistor DT.

The external voltage detector 122 according to an example embodiment of the inventive concepts may generate the detection signal DET according to whether the external voltage EVC applied to the external voltage pad 102 is dropped.

Figure 4:
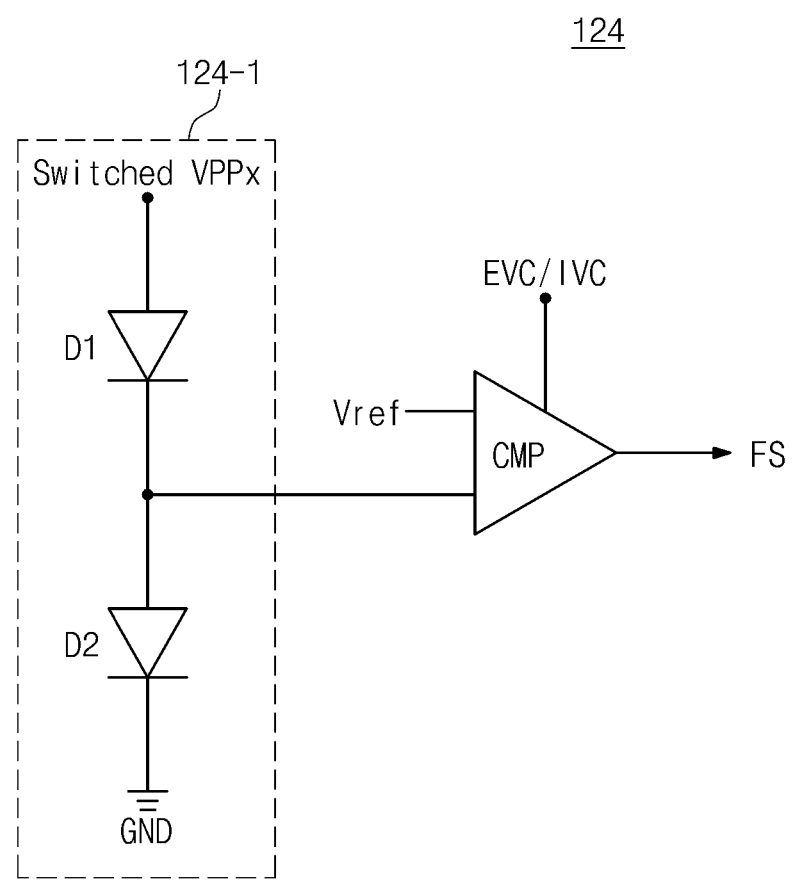
FIG. 4 is a circuit diagram schematically illustrating an external high voltage detector of FIG. 2.

FIG. 4 is a circuit diagram schematically illustrating an external high voltage detector 124 of FIG. 2. Referring to FIG. 4, an external high voltage detector 124 may include a comparator CMP and a voltage divider 124-1 formed of serially connected diodes D1 and D2. The comparator CMP may be driven by the external voltage EVC or an internal voltage IVC, and may compare the reference voltage Vref and a division voltage from the voltage divider 124-1 to generate the flag signal FS. The division voltage may be generated by dividing the high voltage VPPx by the diodes D1 and D2. As illustrated in FIG. 2, the high voltage VPPx may be transferred through a first switch SW1 turned on by the detection signal DET.

In example embodiments, the reference voltage Vref may be generated using the external voltage EVC or the internal voltage IVC. In other example embodiments, the reference voltage Vref may be a voltage different from the external voltage EVC and the external high voltage VPPx provided from the external device.

The external high voltage detector 124 according to an example embodiment of the inventive concepts may generate the flag signal FS according to whether the high voltage VPPx dropped.

As described above, the external voltages EVC and VPPx output from external power control logic 120 in FIG. 1 may be used for a pumping operation for generating driving voltages (e.g., a program voltage Vpgm, a pass voltage Vpass, etc.).

Figure 5:
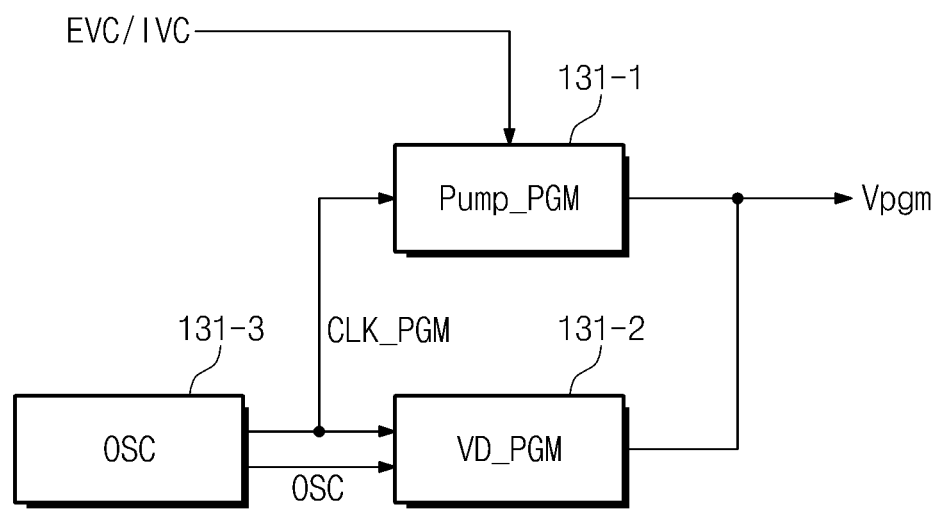
FIG. 5 is a block diagram schematically illustrating a program voltage generator according to an example embodiment of the inventive concepts.

FIG. 5 is a block diagram schematically illustrating a program voltage generator 131 according to an example embodiment of the inventive concepts.

Referring to FIG. 5, the program voltage generator 131 may include a program voltage generator 131 may include a program voltage charge pump 131-1, a program voltage detector 131-2, and a program voltage oscillator 131-3.

The program voltage charge pump 131-1 may generate the program voltage Vpgm in response to a pumping clock signal CLK_PGM. For example, an output voltage may be raised up to the program voltage Vpgm by charging serially connected capacitors with the external voltage EVC or the internal voltage IVC through a pumping operation. The program voltage detector 131-2 may receive an oscillation signal OSC, and may detect an output of the program voltage charge pump 131-1 to generate the pumping clock CLK_PGM. The program voltage oscillator 131-3 may generate the oscillation signal OSC.

As illustrated in FIG. 1, the voltage generating circuit (VGNRT) 130 may generate other voltages such as the erase voltage Vers and the high voltage Vpp in a manner similar to the voltages generated by the program voltage generator 131.

The program voltage generator 131 according to an example embodiment of the inventive concepts may generate the program voltage Vpgm by pumping the external voltage EVC.

Figure 6:
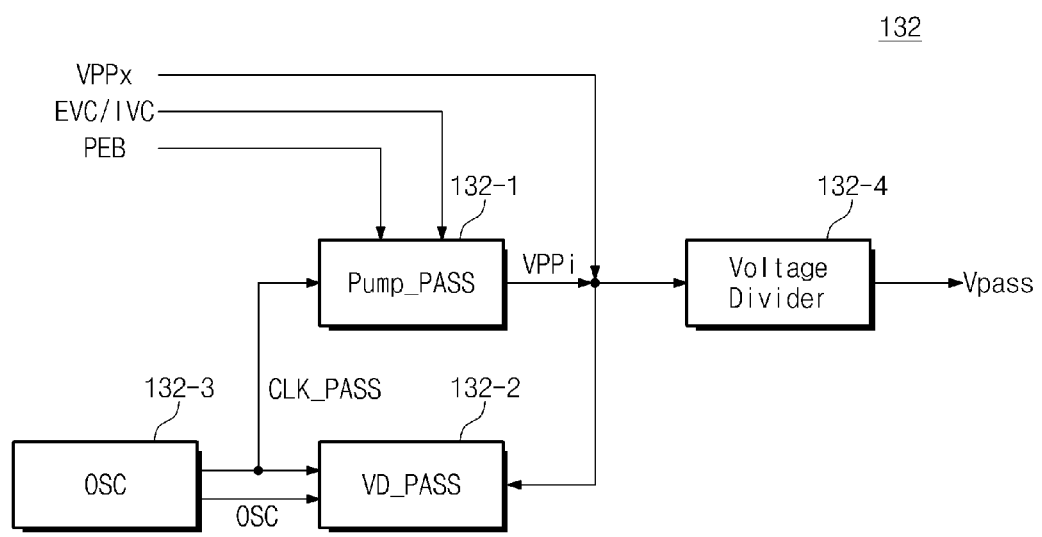
FIG. 6 is a block diagram schematically illustrating a pass voltage generator according to an example embodiment of the inventive concepts.

FIG. 6 is a block diagram schematically illustrating a pass voltage generator 132 according to an example embodiment of the inventive concepts.

Referring to FIG. 6, a pass voltage generator 132 may include a pass voltage charge pump 132-1, a pass voltage detector 132-2, a pass voltage oscillator 132-3, and a voltage divider 132-4.

The pass voltage charge pump 132-1 may generate an internal high voltage VPPi by performing a pumping operation in response to a pumping clock signal CLK_PASS.

The pass voltage charge pump 132-1 may be activated in response to a pump enable signal PEB. For example, in the event that the pump enable signal PEB indicates an application of an external high voltage VPPx, the pass voltage charge pump 132-1 may be inactivated.

The pass voltage detector 132-2 may receive an oscillation signal OSC, and may sense an output of the pass voltage charge pump 132-1 to generate the pumping clock CLK_PASS. The pass voltage oscillator 132-3 may generate the oscillation signal OSC.

The voltage divider 132-4 may divide the external high voltage VPPx or the internal high voltage VPPi to generate a pass voltage Vpass.

In example embodiments, the pass voltage oscillator 132-3 may be embodied in a same circuit as a program voltage oscillator 131-3 of FIG. 3.

An activation of a pumping operation of the pass voltage generator 132 may be decided according to the pump enable signal PEB indicating whether the external high voltage VPPx is received.

Figure 7:
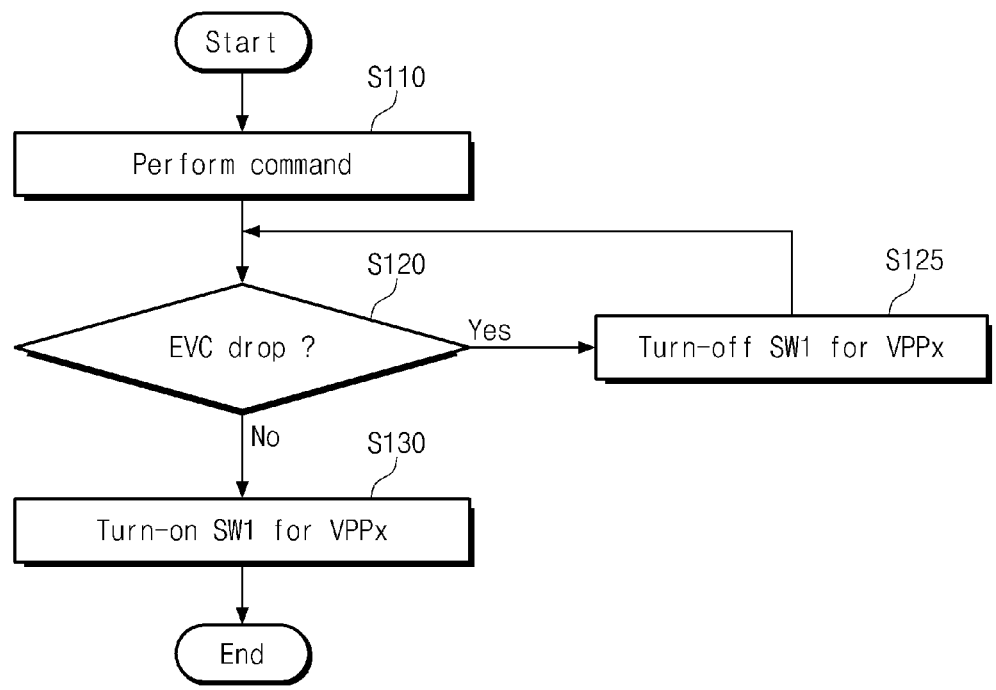
FIG. 7 is a flow chart schematically illustrating an external power control method according to an example embodiment of the inventive concepts when an external voltage is dropped.

FIG. 7 is a flow chart schematically illustrating an external power control method according to an example embodiment of the inventive concepts when an external voltage is dropped.

Referring to FIGS. 2 to 7, in operation S110, a nonvolatile memory device 100 may execute a program/read/erase command. In operation S120, an external voltage detector 122 may determine whether an external voltage EVC is dropped, and may generate a detection signal DET corresponding to a determination value. If the external voltage EVC is determined to have dropped, in operation S125, a first switch SW1 may be turned off such that an external high voltage VPPx is not applied to an internal circuit 101. Afterwards, the method may proceed to operation S120. If the external voltage EVC is determined not to have dropped, in operation S130, the external voltage detector 122 of may turn on the first switch SW1 such that the external high voltage VPPx is applied to the internal circuit 101.

A non-volatile memory device configured to execute the above described external power control method may block an application of the external high voltage VPPx to the internal circuit 101 when a drop of the external voltage EVC is detected.

Figure 8:
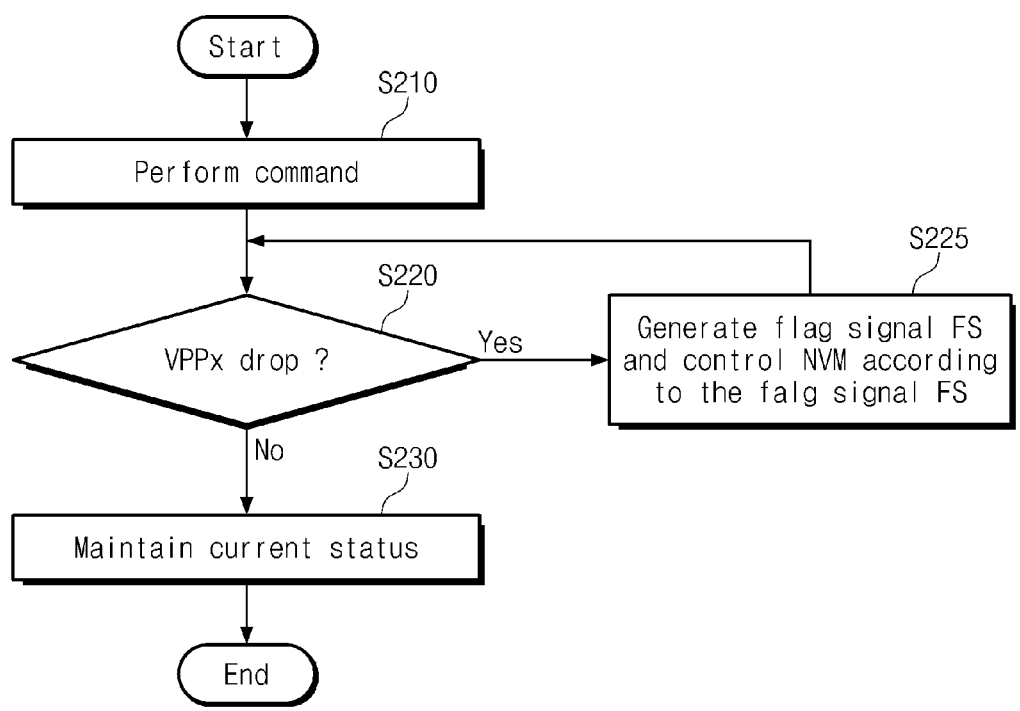
FIG. 8 is a flow chart schematically illustrating an external power control method according to an example embodiment of the inventive concepts when an external high voltage is dropped.

FIG. 8 is a flow chart schematically illustrating an external power control method according to an example embodiment of the inventive concepts when an external high voltage is dropped.

Referring to FIGS. 2 to 8, in operation S210, a nonvolatile memory device 100 may execute a program/read/erase command. In operation S220, an external high voltage detector 124 may determine whether the external high voltage VPPx is dropped. For example, the external high voltage detector 124 may determine whether a voltage obtained by dividing the external high voltage VPPx is lower than a reference voltage Vref.

If the external high voltage detector 124 determines that the voltage obtained by dividing the external high voltage VPPx is lower than the reference voltage Vref, in operation S225, the external high voltage detector 124 may generate the flag signal FS.

The nonvolatile memory device 100 may be controlled by the flag signal FS. For example, in response to the flag signal FS, the nonvolatile memory device 100 may stop a current state (e.g., an operation performed according to the command executed in operation S210), enter a standby mode, discharge a high voltage of an internal circuit 101 or generate a ready/busy signal RnB. Also, a recovery operation of the nonvolatile memory device 100 can be performed in response to the flag signal FS by discharging voltages of word lines WL0 to WLm and bit lines BL0 to BLn at a program/erase/read operation. Afterwards, the method may proceed to operation S220.

If the voltage obtained by dividing the external high voltage VPPx is higher than the reference voltage Vref, in operation S230, the nonvolatile memory device 100 may maintain a current state.

When a drop of the external high voltage VPPx is detected, the nonvolatile memory device 100 may generate the flag signal FS for controlling the internal circuit 101 to secure the stability of the nonvolatile memory device 100.

Figure 9:
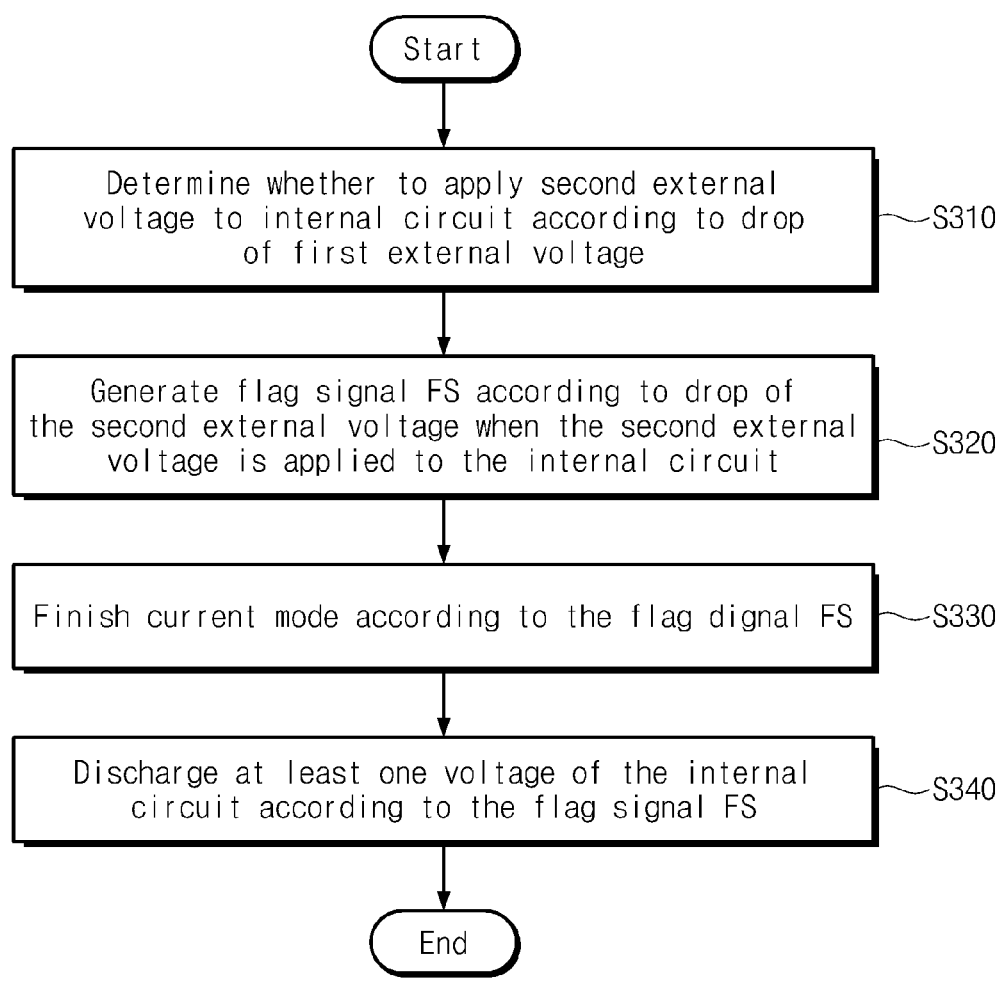
FIG. 9 is a flow chart schematically illustrating an external power control method according to an example embodiment of the inventive concepts.

FIG. 9 is a flow chart schematically illustrating an external power control method according to an example embodiment of the inventive concepts.

Referring to FIGS. 1 to 9, in operation S310, the external voltage detector 122 of the external power control logic 120 may determine whether to apply a second external voltage (e.g., the external high voltage VPPx) to the internal circuit 101, based on a drop of a first external voltage EVC (e.g., the external voltage EVC). The second external voltage VPPx may be higher than the first external voltage EVC.

When the second external voltage VPPx is applied to the internal circuit 101, in operation S320, the external high voltage detector 124 of the external power control logic 120 may generate the flag signal FS in response to a drop of the second external voltage VPPx.

In operation S330, the nonvolatile memory device 100 may terminate a current operating mode in response to the flag signal FS.

After the current operating mode is ended, in operation S340, the internal circuit 101 may discharge at least one voltage of the internal circuit 101.

A nonvolatile memory device 100 executing the above-described external power control method may detect if the external voltage EVC and the external high voltage VPPx are dropped, generate the flag signal FS according to the detection result, and control driving of the nonvolatile memory device 100 in response to the flag signal FS.

FIGS. 10 to 13 are diagrams for describing an effect obtained by the external power control logic 120 according to an example embodiment of the inventive concepts.

Figure 10:
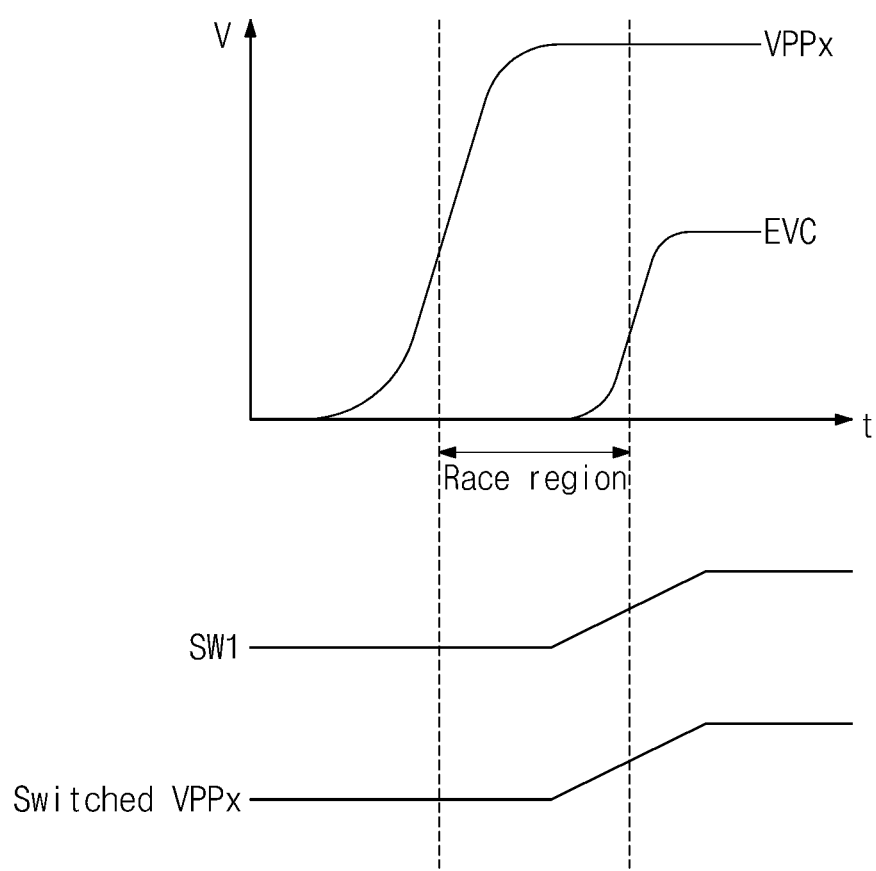
FIGS. 10 to 13 are diagrams for describing an effect obtained through external power control logic 120 according to an embodiment of the inventive concept.

As illustrated in FIG. 10, if the external voltage EVC is a low voltage and the external high voltage VPPx is a normal voltage, the external voltage detector 120 may detect that the external voltage EVC, which may be a main power of the nonvolatile memory device 100, has dropped to a low voltage. The external voltage detector 120 may turn off the first switch SW1 such that the external high voltage VPPx is not applied to the internal circuit 101 of the nonvolatile memory device 100. The external voltage detector 120 may inactivate operations of the internal circuit 101 and all circuits which use the external voltage EVC or a power dependent upon the external voltage EVC.

Although the external high voltage VPPx is applied when the external voltage EVC drops, the turning off of the first switch SW1 in response to the detection signal may prevent the external high voltage VPPx from being applied to the internal circuit 101. Thus, the reliability of circuits in the internal circuit 101 not having a protection circuit against a high voltage may be improved.

Figure 11:
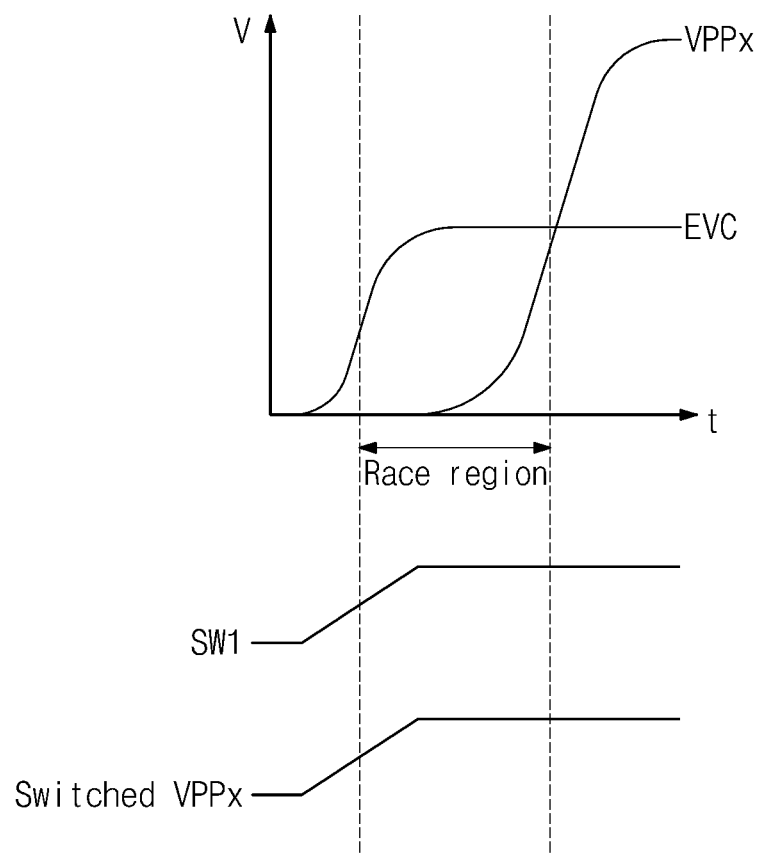

As illustrated in FIG. 11, if the external voltage EVC is a normal voltage and the external high voltage VPPx is a low voltage, the first switch SW1 may be turned on such that the external high voltage VPPx is applied to the internal circuit 101 of the nonvolatile memory device 100.

Figure 12:
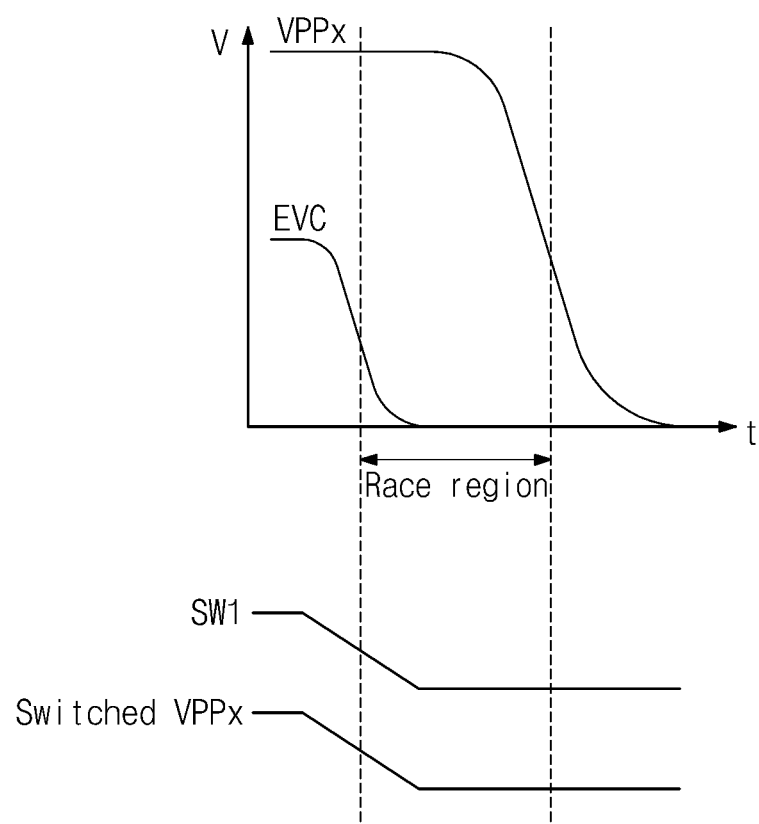

As illustrated in FIG. 12, if the external voltage EVC is a low voltage and the external high voltage VPPx is a normal voltage, the first switch SW1 may be turned off such that the external high voltage VPPx is not applied to the internal circuit 101 of the nonvolatile memory device 100.

Figure 13:
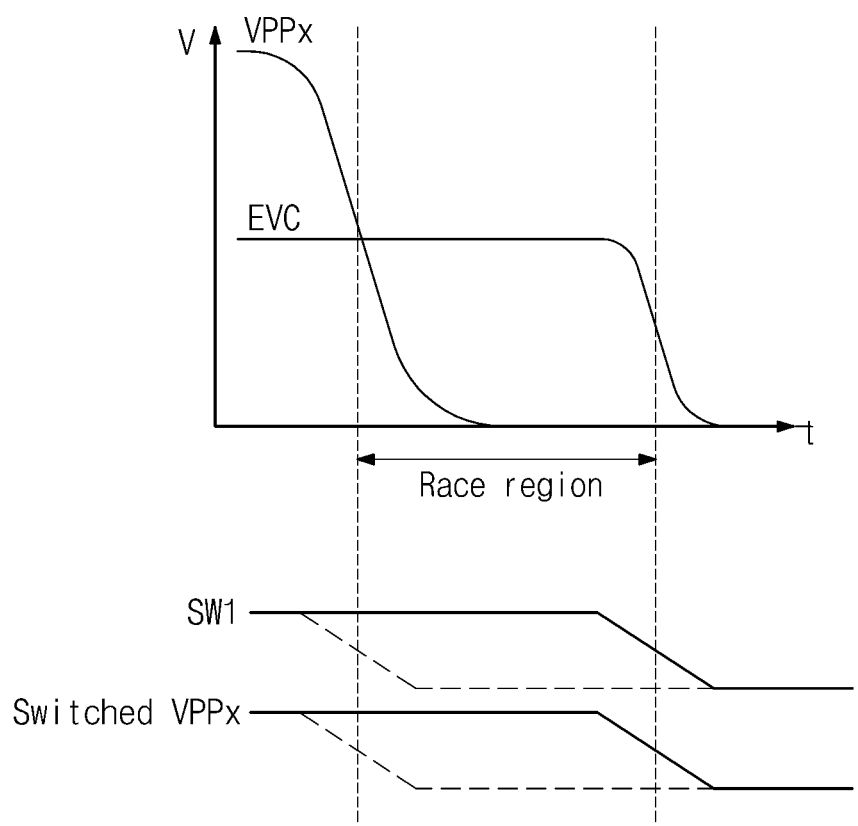

As illustrated in FIG. 13, if the external voltage EVC is a normal voltage and the external high voltage VPPx is a low voltage, the external high voltage detector 124 may generate the flag signal FS when the external high voltage VPPx is lower than the reference voltage Vref. In other words, if a drop of the external high voltage VPPx is generated prior to a drop of the external voltage EVC upon interruption of the external power, the external high voltage detector 124 may generate a flag signal FS. As illustrated in FIG. 2, the second switch SW2 may be turned off by the flag signal FS. Also, voltages of the internal circuit 101 of the nonvolatile memory device 100 may be discharged in response to the flag signal FS to improve the reliability of the nonvolatile memory device 100.

Meanwhile, the first switch SW1 can be turned on or off by the flag signal FS. For example, when the flag signal FS indicates a drop of the external high voltage VPPx, the first switch SW1 may be turned off as illustrated by a dotted line of FIG. 13, regardless of whether the external voltage EVC is a normal voltage.

Figure 14:
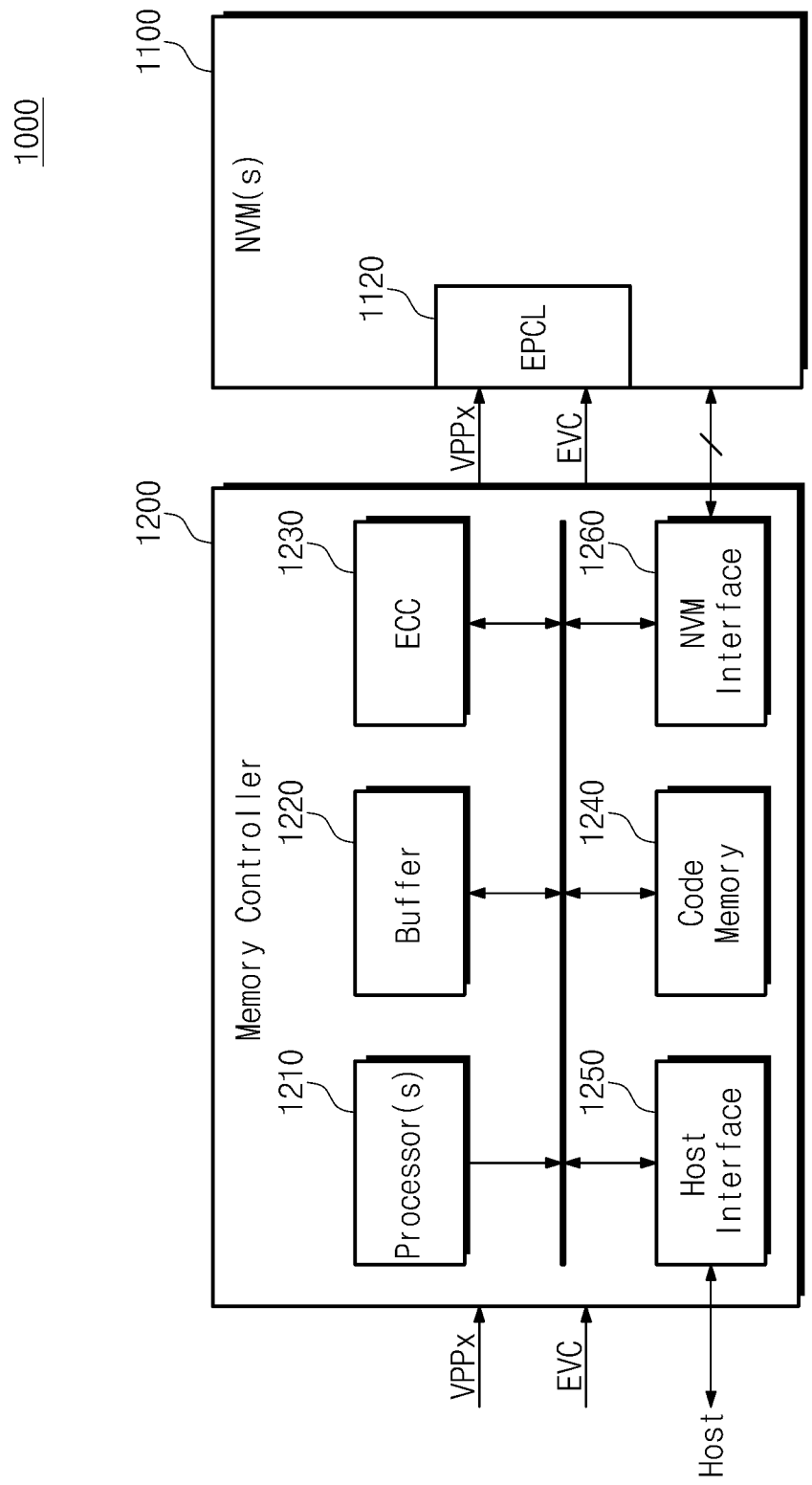
FIG. 14 is a block diagram schematically illustrating a memory system according to an example embodiment of the inventive concepts.

FIG. 14 is a block diagram schematically illustrating a memory system according to an example embodiment of the inventive concepts.

Referring to FIG. 14, a memory system 1000 may include at least one nonvolatile memory device 1100 and a memory controller 1200. An external power control method described with reference to FIGS. 1 to 13 may be applied to the nonvolatile memory device 1100. The memory controller 1200 may be connected to the nonvolatile memory device 1100 through a plurality of channels. The memory controller 1200 may include at least one processor 1210, a buffer memory 1220, an ECC circuit 1230, a code memory 1240, a host interface 1250, and a memory interface 1260.

The memory system 1000 may include external power control logic 1120 which is configured to selectively apply an external power to an internal circuit according to whether the external power is dropped. Thus, it is possible to improve the reliability of the nonvolatile memory device 1100.

In one or more example embodiments, the inventive concepts are applicable to a solid state drive (SSD).

Figure 15:
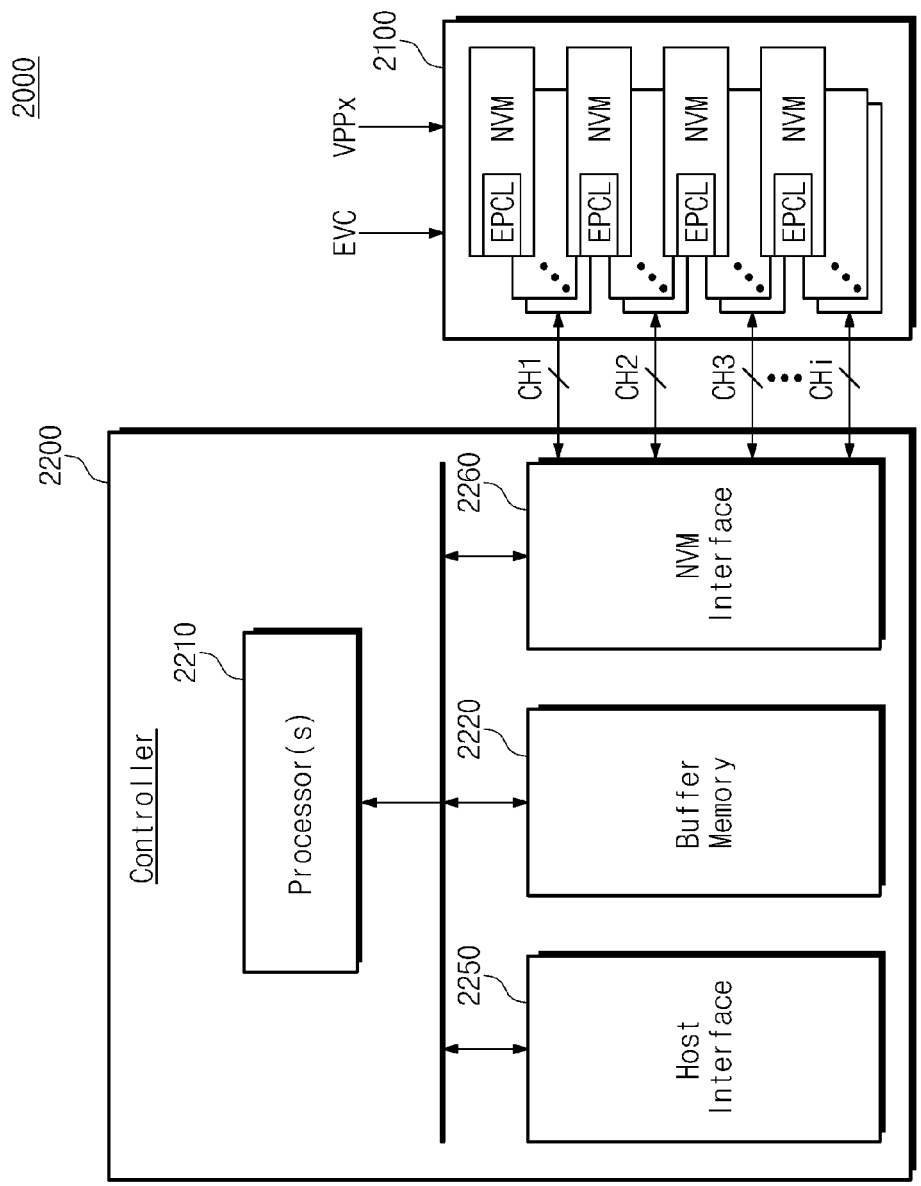
FIG. 15 is a block diagram schematically illustrating a solid state drive according to an example embodiment of the inventive concepts.

FIG. 15 is a block diagram schematically illustrating a solid state drive according to an example embodiment of the inventive concepts.

Referring to FIG. 15, a solid state drive (SSD) 2000 may include a plurality of flash memory devices 2100 and an SSD controller 2200. The flash memory devices 2100 may be configured to be supplied with an external high voltage. An external power control method described with reference to FIGS. 1 to 13 may be applied to each flash memory device 2100. The SSD controller 2200 may be connected to the flash memory devices 2100 via a plurality of channels CH1 to CHi. The SSD controller 2200 may include at least one processor 2210, a buffer memory 2220, a host interface 2250, and a flash interface 2260.

The SSD 2000 may use the external high voltage VPPx to improve power efficiency. Also, the SSD 2000 may include the flash memory devices 2100 each having external power control logic EPCL to improve the reliability of operation.

The inventive concepts are applicable to an embedded MMC (hereinafter, referred to as eMMC).

Figure 16:
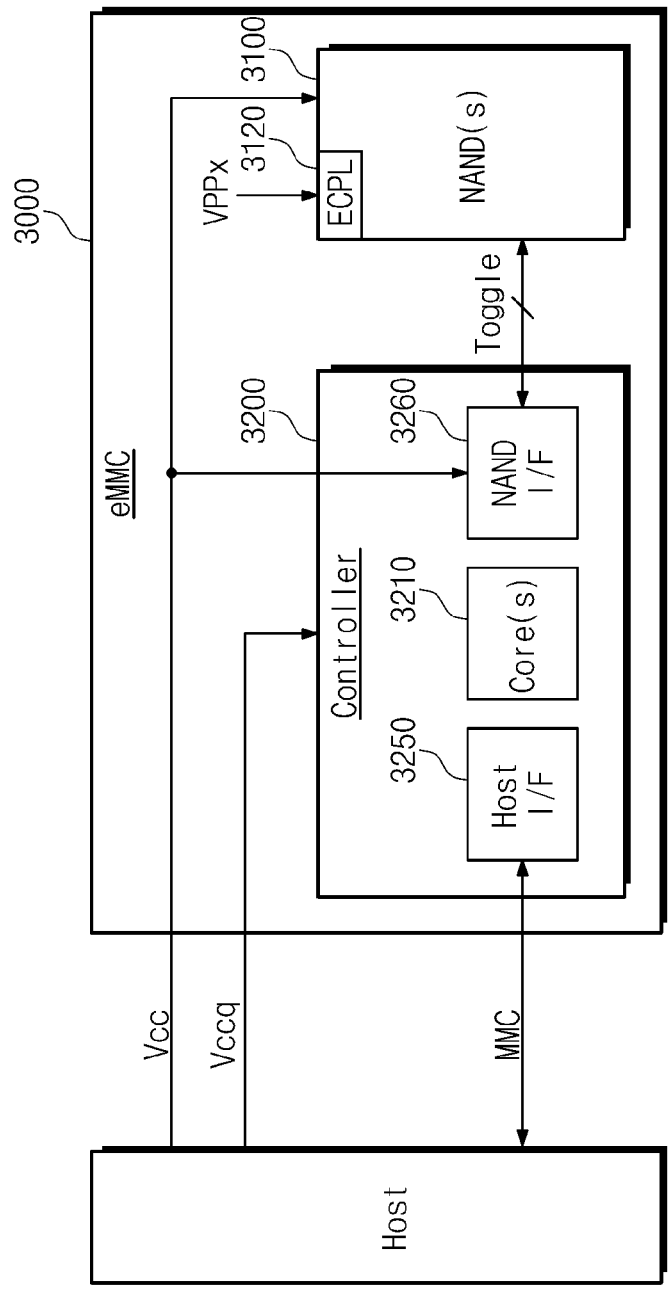
FIG. 16 is a block diagram schematically illustrating an eMMC according to an example embodiment of the inventive concepts.

FIG. 16 is a block diagram schematically illustrating an eMMC according to an example embodiment of the inventive concepts.

Referring to FIG. 16, an eMMC 3000 may include at least one NAND flash memory device 3100 and controller 3200 integrated in a chip. The eMMC 3000 may support the eMMC 4.4 standard.

The NAND flash memory device 3100 may be a single data rate (SDR) NAND flash memory device or a double data rate (DDR) NAND flash memory device. In example embodiments, the NAND flash memory device 3100 may include NAND flash memory chips. Herein, the NAND flash memory device 3100 may be implemented by stacking the NAND flash memory chips at one package (e.g., FBGA, Fine-pitch Ball Grid Array, etc.). An external power control method described with reference to FIGS. 1 to 13 may be applied to each NAND flash memory device.

The controller 3200 may be connected with the flash memory device 3100 via a plurality of channels. The controller 3200 may include at least one controller core 3210, a host interface 3250, and a NAND interface 3260. The controller core 3210 may control an overall operation of the eMMC 3000. The host interface 3250 may be configured to perform an interface between the controller 3210 and a host. The NAND interface 3260 may be configured to provide an interface between the NAND flash memory device 3100 and the controller 3200. In example embodiments, the host interface 3220 may be a parallel interface (e.g., an MMC interface). In other example embodiments, the host interface 3250 of the eMMC 3000 may be a serial interface (e.g., UHS-II, UFS, etc.).

The eMMC 3000 may receive power supply voltages Vcc and Vccq from the host. Herein, the power supply voltage Vcc (about 3.3V) may be supplied to the NAND flash memory device 3100 and the NAND interface 3260, and the power supply voltage Vccq (about 1.8V/3.3V) may be supplied to the controller 3200.

The eMMC 3000 according to an example embodiment of the inventive concepts may use the external high voltage VPPx, so that it is applicable to small-sized and low-power mobile products (e.g., cell phones, tablets, etc.).

Figure 17:
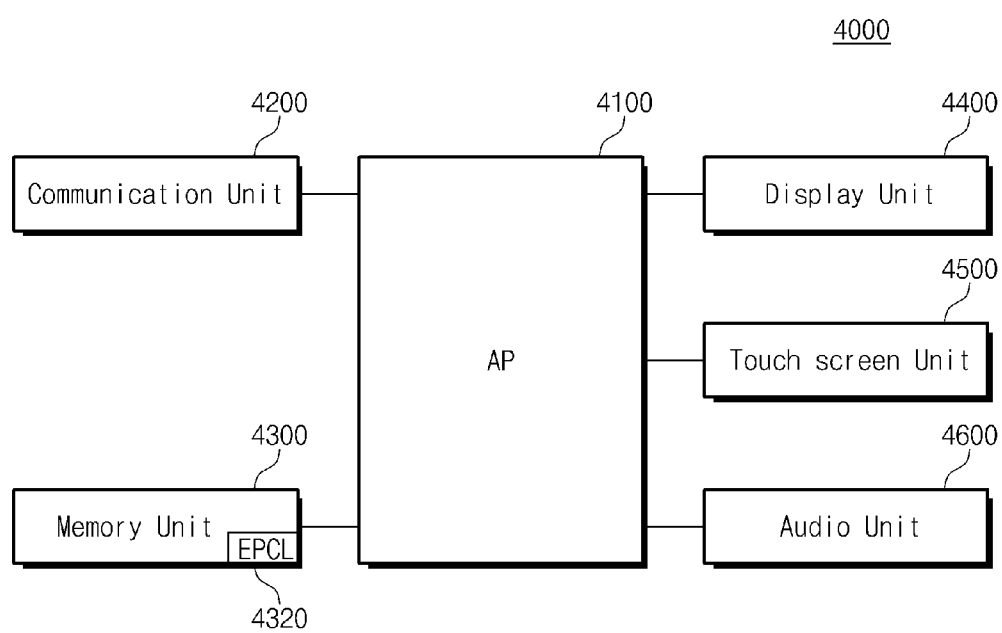
FIG. 17 is a block diagram schematically illustrating a communication device according to an example embodiment of the inventive concepts.

FIG. 17 is a block diagram schematically illustrating a communication device according to an example embodiment of the inventive concepts.

Referring to FIG. 17, a communication device 4000 may include an application processor 4100, a communication unit 4200, a memory unit 4300, a display unit 4400, a touch screen unit 4500, and an audio unit 4600. The memory unit 4300 may include at least one buffer memory and at least one nonvolatile memory device. Herein, an external power control method described with reference to FIGS. 1 to 13 may be applied to the nonvolatile memory device.

While the inventive concepts have been described with reference to example embodiments, it will be apparent to those skilled in the art that various changes and modifications may be made without departing from the spirit and scope of the example embodiments. Therefore, it should be understood that the above example embodiments are not limiting, but illustrative.

What is claimed is:

1. An external power control method of a nonvolatile memory device, the nonvolatile memory device including an internal circuit, the internal circuit housing a memory cell array, the method comprising:
    determining whether to apply a second external voltage to a first node according to a drop in a first external voltage, the determining whether to apply the second voltage to the first node including,
        generating a detection signal when the first external voltage drops, and
        applying the second external voltage to the first node in response to the detection signal;
    generating a flag signal according to a drop of the second external voltage when the second external voltage is applied to the first node;
    selectively disconnecting the first node from a second node in response to the flag signal, the second node electrically connected to the internal circuit; and
    discharging at least one voltage of the internal circuit connected to the second node in response to the flag signal.

2. The external power control method of claim 1, wherein the second external voltage is higher than the first external voltage.

3. The external power control method of claim 2, further comprising:
    protecting the internal circuit such that the second external voltage is not applied to the internal circuit when the first external voltage is not applied to the nonvolatile memory device and the second external voltage is applied to the nonvolatile memory device.

4. The external power control method of claim 1, wherein the generating the flag signal comprises:
    dividing the second external voltage;
    comparing the divided voltage and a reference voltage; and
    generating the flag signal when the divided voltage is lower than the reference voltage.

5. The external power control method of claim 4, wherein the reference voltage is generated using the first external voltage.

6. The external power control method of claim 1, further comprising:
    terminating a current mode of the nonvolatile memory device in response to the flag signal; and
    enabling a standby mode of the nonvolatile memory device.

7. The external power control method of claim 1, further comprising:
    outputting information, indicating the nonvolatile memory device does not receive a command, in response to the flag signal, and wherein the at least one voltage includes voltages of word lines and bit lines.

8. A nonvolatile memory device, comprising:
    a memory cell array having a plurality of memory blocks;
    external power control logic configured to,
        receive first and second external voltages,
        detect a voltage drop in the first and second external voltages, and
        decide whether to block the first and second external voltages according to a result of the detection, the second external voltage being higher than the first external voltage;

a voltage generating circuit configured to generate driving voltages, to drive the memory cell array, based on the first and second external voltages provided through the external power control logic such that the voltage generating circuit does not generate one or more of the driving voltages used to drive the memory cell array, if the external power control logic detects the voltage drop in one of the first and second external voltages;

an address decoder configured to select one of the memory blocks in response to an address and to provide the driving voltages to the selected block;

an input/output circuit configured to temporarily store data to be programmed to memory cells of the selected memory block or data read from memory cells of the selected memory block; and control logic configured to control the voltage generating circuit, the address decoder, and the input/output circuit.

9. The nonvolatile memory device of claim 8, wherein the external power control logic comprises:
   a first external voltage detector configured to generate a detection signal based on whether the first external voltage applied through a first external voltage pad drops; and
   a second external voltage detector configured to,
      provide the voltage generating circuit with the second external voltage applied through a second external voltage pad in response to the detection signal, and
      generate a flag signal according to whether the second external voltage drops.

10. The nonvolatile memory device of claim 9, wherein the first external voltage detector comprises:
    a depletion transistor having a drain connected to the second external voltage pad and a gate connected to an output terminal transmitting the detection signal;
    a PMOS transistor having a drain connected to a source of the depletion transistor, a source connected to the output terminal, and a gate connected to the first external voltage pad; and
    an NMOS transistor having a source connected to the output terminal, a drain grounded, and gate connected to the first external voltage pad.

11. The nonvolatile memory device of claim 9, wherein the second external voltage detector comprises:
    a voltage divider configured to divide the second external voltage, applied to the voltage generating circuit, to generate a division voltage; and
    a comparator configured to,
       compare the division voltage and a reference voltage, and
       output the flag signal when the division voltage is lower than the reference voltage.

12. The nonvolatile memory device of claim 11, wherein the nonvolatile memory device is configured to perform a recovery operation in response to the flag signal to discharge word lines and bit lines connected to the plurality of memory blocks.

13. The nonvolatile memory device of claim 9, wherein the external power control logic further comprises:
    a first switch connected to the second external voltage pad, the first switch configured to output the second external voltage applied to the second external voltage pad as a switched high voltage in response to the detection signal; and
    a second switch configured to block an application of the switched high voltage to the voltage generating circuit in response to the flag signal.

14. The nonvolatile memory device of claim 9, wherein the external power control logic further comprises:
    a first switch connected to the second external voltage pad, the first switch configured to,
       apply the second external voltage applied to the second external voltage pad to the voltage generating circuit in response to the detection signal, and
       block an application of the second external voltage to the voltage generating circuit in response to the flag signal.

15. The nonvolatile memory device of claim 8, wherein the voltage generating circuit does not perform a pumping operation for generating at least one voltage when the second external voltage is applied to the nonvolatile memory device.

16. The nonvolatile memory device of claim 15, wherein the voltage generating circuit comprises:
    a program voltage generator configured to generate a program voltage, the program voltage generator including,
       a program voltage charge pump configured to,
          receive the first external voltage, and
          generate the program voltage by performing a pumping operation in response to a first pumping clock;
       a program voltage detector connected to an output terminal of the program voltage charge pump, the program voltage detector configured to,
          detect whether the program voltage reaches a target voltage, and
          generate the first pumping clock in response to a first oscillation signal and a result of the detection of whether the program voltage reached the target voltage; and
       a program voltage oscillator configured to generate the first oscillation signal.

17. The nonvolatile memory device of claim 15, wherein the voltage generating circuit comprises:
    a pass voltage generator configured to generate a pass voltage, the pass voltage generator including,
       a pass voltage charge pump configured to,
          receive the first external voltage when the second external voltage is not applied to the nonvolatile memory device, and
          generate an internal high voltage by performing a pumping operation in response to a second pumping clock;
       a pass voltage detector connected to an output terminal of the pass voltage charge pump, the pass voltage detector configured to,
          detect whether the pass voltage reaches a target voltage, and
          generate the second pumping clock in response to a second oscillation signal and a result of the detection of whether the pass voltage reaches the target voltage;
       a pass voltage oscillator configured to generate the second oscillation signal; and
       a voltage divider configured to generate the pass voltage by dividing the second external voltage or the internal high voltage.

18. The nonvolatile memory device of claim 8, wherein the control logic comprises:
    an external voltage set register configured to,
       receive an external voltage command indicating whether the second external voltage is applied to the nonvolatile memory device from an external device, and
       store data corresponding to the external voltage command.

19. The nonvolatile memory device of claim 18, wherein the control logic is configured to generate a pump enable signal based on the data stored in the external voltage set register, and
the voltage generating circuit is configured to perform a pump operation in response to the pump enable signal to generate the driving voltages to drive the memory cell array.

20. A memory system, comprising:
at least one nonvolatile memory device, the at least one nonvolatile memory device including,
external power control logic configured to,
determine whether to apply a second external voltage to an internal circuit of the at least one nonvolatile memory device according to a drop of a first external voltage, and
generate a flag signal according to a drop of the second external voltage when the second external voltage is applied to the internal circuit, the second external voltage being higher than the first external voltage; and
an external voltage set register configured to,
receive an external voltage command indicating whether the second external voltage is applied to the nonvolatile memory device from an external device, and
store data corresponding to the external voltage command; and
a memory controller configured to control the at least one nonvolatile memory device.

21. The memory system of claim 20, wherein the at least one nonvolatile memory device comprises:
a plurality of nonvolatile memory devices connected to the memory controller through a plurality of channels.

22. The memory system of claim 21, wherein the second external voltage is 12V.

23. The memory system of claim 20, wherein the at least one nonvolatile memory device and the memory controller are integrated in a same chip.

24. The memory system of claim 20, wherein the memory controller is configured to,
generate the external voltage command in response to a host request or a user request, and
send the external voltage command to the at least one nonvolatile memory device.

25. The memory system of claim 20, wherein when an input of the second external voltage is detected, the memory controller is configured to generate the external voltage command to be sent to the at least one nonvolatile memory device.

26. The memory system of claim 20, wherein the at least one nonvolatile memory device is configured to enter a standby mode in response to the flag signal.

27. A memory device comprising:
an internal circuit including a memory cell array having a plurality of memory blocks therein; and
a power controller configured to,
supply one or more of a first external voltage and a second external voltage to the internal circuit,
detect a voltage decrease in the first external voltage and the second external voltage, and
prohibit supply of the second external voltage to the internal circuit such that one or more operation of the internal circuit that utilize the second external voltage are deactivated, if the power controller detects the voltage decrease in one of the first external voltage and the second external voltage.

28. The memory device of claim 27, wherein the power controller further comprises:
a first external voltage detector including a plurality of transistors configured to generate a detection signal in response to detecting the voltage decrease in the first external voltage; and
a second external voltage detector including,
a voltage divider configured to divide the second external voltage,
a comparator configured to compare the divided voltage and a reference voltage, and
generate a flag signal if the divided voltage is lower than the reference voltage.

29. The memory device of claim 27, wherein the second external voltage has a higher voltage than the first external voltage, and the internal circuit further comprises:
a voltage generator configured to,
receive the first external voltage from the power controller,
selectively receive the second external voltage, if the power controller does not detect the voltage decrease in one of the first external voltage and the second external, and
generate driving voltages to drive the memory cell array using the first external voltage and the second external voltage; and
an internal controller configured to receive a flag signal from the power controller, the flag signal indicating whether the power controller detects the voltage decrease in the second external voltage.

30. The memory device of claim 29, wherein the internal controller is configured to instruct the nonvolatile memory device to discharge word lines and bit lines connected to the plurality of memory blocks if the flag signal indicates that the power control logic has detected the voltage decrease in the second external voltage.

* * * * *